(12) United States Patent
Proscia et al.

(10) Patent No.: US 6,242,045 B1
(45) Date of Patent: Jun. 5, 2001

(54) PROCESS OF PREPARING METAL NITRIDE FILMS USING A METAL HALIDE AND AN AMINE

(75) Inventors: James William Proscia, Dearborn; Keith Brian Williams, Detroit; Gene P. Reck, Franklin, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 08/083,206

(22) Filed: Jun. 24, 1993

Related U.S. Application Data

(63) Continuation of application No. 07/806,174, filed on Dec. 13, 1991, now abandoned.

(51) Int. Cl.$^7$ .................................................. C23C 16/34
(52) U.S. Cl. ............................ 427/255.391; 427/255.394; 427/255.11; 427/166
(58) Field of Search ................................. 427/248.1, 255, 427/255.1, 255.391, 255.394, 255.11, 166; 423/409, 411, 412; 428/698

(56) References Cited

U.S. PATENT DOCUMENTS

| | | | |
|---|---|---|---|
| 3,784,402 | 1/1974 | Reedy, Jr. ............................... | 117/69 |
| 4,091,169 | * 5/1978 | Bohg et al. ............................ | 427/122 |
| 4,162,338 | 7/1979 | Schintlmeister ....................... | 427/249 |
| 4,535,000 | * 8/1985 | Gordon ............................... | 427/255.2 |
| 4,716,048 | * 12/1987 | Ishihara et al. ..................... | 427/39 |
| 4,946,712 | * 8/1990 | Goodman et al. .................. | 427/255.1 |
| 5,087,593 | * 2/1992 | Narula ................................ | 501/96 |
| 5,114,750 | * 5/1992 | Howard .............................. | 427/226 |
| 5,194,642 | * 3/1993 | Winter et al. ....................... | 556/51 |

FOREIGN PATENT DOCUMENTS

| | | |
|---|---|---|
| 0 425 825 | 5/1991 | (EP) . |
| 62-070208 | * 3/1987 | (JP) . |
| 62-108719 | 5/1987 | (JP) . |
| WO-8 402 128 | 6/1984 | (WO) . |

OTHER PUBLICATIONS

Wakefield, G.F. et al, "Preparationn of Titanium Carbonitride from Mono–, Di–, and Tri–Methyl Amines" CVD 4$^{th}$ International Conference 1973 pp. 173–180.*

"Titanium Nitride Thin Films: Properties and APCVD Synthesis Using Organometallic Precursors" MRS Symp Proc., vol. 158 (1990) pp. 357–362.

* cited by examiner

*Primary Examiner*—Shrive Beck
*Assistant Examiner*—Bret Chen
(74) *Attorney, Agent, or Firm*—Rhonda L. McCoy-Pfau

(57) ABSTRACT

Metal nitrides are prepared by reacting a metal halide with an amine at an elevated temperature. The process is useful for depositing titanium nitride and vanadium nitride films onto glass, to make solar control automotive and architectural glazings.

18 Claims, No Drawings

PROCESS OF PREPARING METAL NITRIDE FILMS USING A METAL HALIDE AND AN AMINE

This application is a continuation of application Ser. No. 07/806,174, filed Dec. 13, 1991, now abandoned.

FIELD OF THE INVENTION

This invention relates generally to the preparation of metal nitrides, and more particularly, to the deposition of metal nitride films onto substrates such as glass.

BACKGROUND OF THE INVENTION

Organic and metallic precursors have been used in recent years to prepare advanced coating materials such as titanium nitride, vanadium nitride, boron nitride, tungsten dinitride, etc. These advanced coating materials have advantageously been deposited onto transparent glazings, e.g., glass, by well-known coating processes such as, for example, atmospheric pressure chemical vapor deposition (APCVD), low pressure chemical vapor deposition (LPCVD), spray pyrolysis, plasma enhanced chemical vapor deposition (PECVD), laser-induced chemical vapor deposition (LCVD), etc. The ultimately produced coated glazings may be used in automotive or architectural applications which require reduced solar and infrared radiation transmittances.

Titanium nitride is a particularly useful advanced material having several desirable properties such as, for example, high hardness (8–9 on the Moh scale), excellent solar and infrared reflectances, and nonreactivity with a variety of corrosive atmosphere.

Titanium nitride films may be deposited onto glass by continuously coating a hot glass ribbon as it is being produced by the well-known float process. Conventional titanium nitride filming methods involve the high temperature reaction of a source of titanium such as, for example, titanium tetrachloride, with ammonia. Such a method is disclosed in U.S. Pat. No. 4,535,000 to Gordon.

Fix, R. M. et al., "Titanium Nitride Thin Films: Properties and APCVD Synthesis Using Organometallic Precursors," Mat. Res. Soc. Symp. Proc., vol. 158 (1990) pp. 357–362 discloses a method for depositing thin titanium nitride films onto glass, by reacting together tetrakis(dialkylamido) titanium compounds and excess ammonia at about 100° C. to about 400° C. near the surface of the glass.

U.S. Pat. No. 3,784,402 to Reedy, Jr. discloses a method for producing metal carbonitrides. A gaseous stream containing hydrogen, a metal halide such as titanium tetrachloride, and an amine such as ethylene diamine, trimethylamine, or pyridine is reacted near the surface of a titanium metal or titanium nitride substrate. The amine decomposes during the reaction to yield nitrogen and carbon, which thereafter are used in the formation of the carbonitride. The patent also discloses the well-known reaction wherein titanium nitride is formed by the reaction between titanium tetrachloride, nitrogen, and hydrogen.

Finally, U.S. Pat. No. 4,162,338 to Schintlmeister discloses that a titanium carbonitride film may be formed by reacting together a titanium halide, a hydrocarbon gas, and an aliphatic or aromatic amine at a temperature from about 700° C. to about 1,200° C. The patent also discloses that titanium nitride may be formed by reacting together a titanium halide and nitrogen.

The prior art referred to herinabove has been collected and examined only in light of the present invention as a guide. It is not to be inferred that such diverse art would otherwise be assembled absent the motivation provided by the present invention, nor that the cited prior art when considered in combination suggests the present invention absent the teachings herein.

SUMMARY OF THE INVENTION

Accordant with the present invention, a process for preparing metal nitrides has surprisingly been discovered. The process comprises contacting a metal halide with an amine at a temperature sufficient to form a metal nitride.

Also contemplated by the present invention is a process for depositing a metal nitride film onto glass. Preferred metal nitrides according to the present invention are titanium nitride and vanadium nitride.

The processes of the present invention are particularly well suited for preparing solar control automotive and architectural coated glazings.

DETAILED DESCRIPTION OF THE PREFERRED EMBODIMENT

The present invention is directed to the preparation of a metal nitride, by reacting together a metal halide and an amine.

The first reactant for use in preparing metal nitrides according to the present invention is a metal halide. Metal halides are compounds well-known to those ordinarily skilled in the chemical arts, and include, without limitation, titanium tetrachloride, titanium tetrabromide, vanadium tetrachloride, boron trichloride, tungsten hexachloride, tungsten pentachloride, tungsten hexafluoride, and the like. Useful metal halides also include compounds containing transition metals from groups 4, 5, and 6, or elements from groups 13, 14, and 15, and halogens, i.e., chlorine, fluoring, bromine, and iodine. Preferred metal halides include titanium tetrachloride and vanadium tetrachloride, useful for depositing films of titanium nitride and vanadium nitride, respectively. Titanium tetrachloride may be prepared by heating a quantity of titanium dioxide or titanium-containing ore along with carbon while passing a stream of chlorine gas thereover. Vanadium tetrachloride may be prepared by chlorinating vanadium metal or ferrovanadium at about 300° C. Further details concerning the manufacture and properties of titanium halides and vanadium halides are more fully set forth in the Kirk-Othmer Concise Encyclopedia of Chemical Technology, John Wiley & Sons, New York (1985) pp. 1185–1186 and 1218–1219.

The second reactant for use in preparing metal nitrides according to the present invention is an amine. Suitable reactants may be primary, secondary, or tertiary amines. Examples of contemplated equivalent amines having the same operability and utility include, without limitation, t-butylamine, isoproplyamine, diethylamine, triethylamine, isobutylamine, ethylenediamine, methylamine, dimethylamine, trimethylamine, ethylamine, n-butylamine, isobutylamine, cyclchexylamine, benzylamine, phenylethylamine, tetramethylenediamine, hexamethylenediamine, aniline, triphenylamine, and the like, as well as mixtures thereof. Useful amines include, but are not limited to, straight or branched alkyl amines containing 1 to about 8 carbon atoms. Preferred amines include t-butylamine and isopropylamine, as well as mixtures thereof.

In a preferred embodiment of the process of the present invention, the metal halide and amine each, individually may be vaporized, and the vapors combined adjacent the surface of a hot glass ribbon to prepare glass having a film of a metal nitride thereon. It is preferred that the amine be present in the reaction zone at a concentration equal to at least about one stoichiometric equivalent of the metal halide. A greater excess of the amine, in the range of at least about ten stoichiometric equivalents, is particularly preferred for producing high quality metal halide films.

It is observed, as has been reported in the prior art referred to hereinabove, that hydrogen, a metal halide, and an amine react together to form a metal carbonitride on a titanium metal or titanium nitride substrate. It has now surprisingly been discovered that a metal halide may be reacted with an amine to produce a substantially carbon-free metal nitride on virtually any substrate. This is unexpected, since amines contain an equal amount or more of carbon in relation to the amount of nitrogen.

While not wishing to be bound by any particular theory regarding the mechanism by which amines react with a metal halide to form a nitride rather than a carbonitride, it is believed that, in the absence of hydrogen in the reaction mixture, the amine displaces a halide atom from the metal halide. For example, titanium tetrachloride loses a chlorine atom, which is transported away as HCl if a primary or secondary amine is used, or as an alkyl chloride if a tertiary amine is used. The resulting amido-titanium compound then eliminates additional halides or alkyl halides to produce, for example, ClTiN. Finally, this compound eliminates the halide atom to produce the metal nitride.

The inventive reaction may be carried out at the surface of a hot glass ribbon, to prepare a film of a substantially carbon-free metal nitride thereon. The temperature at which the reaction occurs is not sharply critical, and lies within a broad range from about 400° C. to about 1,100° C. Preferably, the reaction is carried out at conventional glass processing temperatures, from about 500° C. to about 700° C. Moreover, the reaction may proceed within or without a float glass facility bath, utilizing a conventional coater such as is set forth in U.S. Pat. No. 4,922,833, which is incorporated herein in its entirety by reference thereto.

As will readily be apparent to those ordinarily skilled in the art, the required reaction temperature may be achieved by conventional methods, such as by heating the metal halide and amine reactant streams before contacting them together, or may be achieved by directing the reactant streams together adjacent a heated substrate, e.g., a hot glass ribbon being produced by the well-known float glass process.

Metal nitride films may be deposited onto substrates such as glass by the process of the present invention at thicknesses from about 20 Angstroms to about 5,000 Angstroms. A preferred thickness range, suitable for preparing solar control automotive and architectural glazings, is from about 100 Angstroms to about 1,500 Angstroms. Such films may be deposited onto virtually any substrate that can withstand the reaction temperature, including, without limitation, glass, ceramic, quartz, metals, etc. A preferred substrate is a glass ribbon as it is being produced by a float glass facility. The glass may be of any thickness generally known in the industry as useful for making automotive or architectural glazings. A preferred filmed glazing comprises glass having a film of titanium nitride or vanadium nitride deposited thereon.

The process conditions are not sharply critical for the successful preparation of glazings having metal nitride films thereon, according to the present invention. The chemical reactions and process conditions described hereinabove are generally disclosed in those terms which are conventional to the practice of the present invention. Occasionally, however, the process conditions as described may not be applicable for each chemical reactant included within the disclosed scope. Those reactants for which this occurs will readily be recognizable to those ordinarily skilled in the art. In all such cases, either the process may be successfully performed by conventional modifications known to those of ordinary skill in the art, e.g., by changing to alternative conventional chemical reactants, or other process conditions which are otherwise conventional will be applicable to the practice of the present invention.

EXAMPLE

A gas stream comprising about 0.6 liters per minute of 0.7% titanium tetrachloride in nitrogen is reacted with a gas stream comprising about 0.29 liters per minute of 30% t-butylamine in nitrogen at a temperature of about 600° C. near the surface of a glass substrate, thereby depositing a film of titanium nitride onto the surface thereof. The titanium nitride film so deposited is golden in color and exhibits an infrared energy reflectance of about 80% and a resistivity of about 110 microhm-cm.

Other examples may be performed with similar success by substituting the generically or specifically described reactants and/or reaction conditions recited herein for those used in the preceding Example.

From the foregoing description, one ordinarily skilled in the art can easily ascertain the essential characteristics of this invention and, without departing from the spirit and scope thereof, can make various changes and modifications to adapt the invention to various usages and conditions. For example, the present process may be used to deposit a film of a metal nitride onto a glass substrate already having a layer of another film, e.g., a metal oxide, adhered thereto. Moreover, other gases which do not participate in the metal nitride forming reaction, e.g., helium or nitrogen, may be used as carriers for the metal halide and amine vapors. Finally, the process of the present invention may be used to deposit a metal nitride onto surfaces other than glass; for example, it may be used to deposit an abrasion-resistant layer of boron nitride onto a machine component, to prevent excessive wear and premature failure thereof.

What is claimed is:

1. A chemical vapor deposition process for preparing a substantially carbon-free metal nitride, comprising contacting a metal halide with an amine in the absence of hydrogen at a temperature sufficient to form the metal nitride.

2. The process for preparing a metal nitride according to claim 1, wherein the metal halide is selected from the group consisting of titanium tetrachloride and vanadium tetrachloride.

3. The process for preparing a metal nitride according to claim 1, wherein the metal halide is contacted with at least about one stoichiometric equivalent of the amine.

4. The process for preparing a metal nitride according to claim 3, wherein the metal halide is contacted with at least about ten stoichiometric equivalents of the amine.

5. The process for preparing a metal nitride according to claim 1, wherein the reaction temperature is from about 400° C. to about 1,100° C.

6. The process for preparing a metal nitride according to claim 5, wherein the reaction temperature is from about 500° C. to about 700° C.

7. A chemical vapor deposition process for preparing a substantially carbon-free metal nitride, comprising contacting a metal halide selected from the group consisting of titanium tetrachloride and vanadium tetrachloride with at least about one stoichiometric equivalent of an amine in the absence of hydrogen at a temperature form about 500° C. to about 700° C.

8. A chemical vapor deposition process for preparing a substantially carbon-free titanium nitride, comprising contacting titanium tetrachloride with at least about one stoichiometric equivalent of an amine in the absence of hydrogen at a temperature from about 500° C. to about 700° C.

9. The process for preparing titanium nitride according to claim 8, wherein the amine is selected from the group consisting of t-butylamine, isopropylamine, and mixtures thereof.

10. A chemical vapor deposition process for deposition of a substantially carbon-free metal nitride film onto a surface of a substrate, comprising contacting a metal halide with an amine adjacent the surface of the substrate in the absence of hydrogen at a temperature sufficient to form a film of the metal nitride on said surface.

11. The process for depositing a metal nitride film onto a surface of a substrate according to claim 10, wherein the metal halide is selected from the group consisting of titanium tetrachloride and vanadium tetrachloride.

12. The process for depositing a metal nitride film onto a surface of a substrate according to claim 10, wherein the metal halide is contacted with at least about one stoichiometric equivalent of the amine.

13. The process for depositing a metal nitride film onto a surface of a substrate according to claim 12, wherein the metal halide is contacted with at least about ten stoichiometric equivalents of the amine.

14. The process for depositing a metal nitride film onto a surface of a substrate according to claim 10, wherein the reaction temperature is from about 400° C. to about 1,100° C.

15. The process for depositing a metal nitride film onto a surface of a substrate according to claim 14, wherein the reaction temperature is from about 500° C. to about 700° C.

16. A chemical vapor deposition process for deposition of a substantially carbon-free metal nitride film onto a surface of a substrate, comprising contacting a metal halide selected from the group consisting of titanium tetrachloride and vanadium tetrachloride with at least about one stoichiometric equivalent of an amine adjacent the surface of the substrate in the absence of hydrogen at a temperature from about 500° C. to about 700° C. to form a film of the metal nitride on said surface.

17. A chemical vapor deposition process for depositing a substantially carbon-free titanium nitride film onto a surface of a glass substrate, comprising contacting titanium tetrachloride with at least about one stoichiometric equivalent of an amine adjacent the surface of the substrate in the absence of hydrogen at a temperature from about 500° C. to about 700° C. to form a film of the titanium nitride on said surface.

18. The process for depositing a titanium nitride film onto a surface of a glass substrate according to claim 17, wherein the amine is selected from the group consisting of t-butylamine, isopropylamine, and mixtures thereof.

* * * * *